United States Patent [19]

Chan

[11] 4,370,737
[45] Jan. 25, 1983

[54] SENSE AMPLIFIER AND SENSING METHODS

[75] Inventor: John Y. Chan, Belmont, Calif.

[73] Assignee: Fairchild Camera and Instrument Corporation, Mountain View, Calif.

[21] Appl. No.: 120,426

[22] Filed: Feb. 11, 1980

[51] Int. Cl.³ .............................................. G11C 11/24
[52] U.S. Cl. .................................. 365/203; 365/205; 365/210
[58] Field of Search ............... 365/203, 210, 205, 174, 365/208; 307/355, 530

[56] References Cited

U.S. PATENT DOCUMENTS

| | | | |
|---|---|---|---|
| 3,514,765 | 5/1970 | Christensen | 365/205 |
| 3,678,473 | 7/1972 | Wahlstrom | 365/206 |
| 3,949,383 | 4/1976 | Askin et al. | 365/203 |
| 3,949,385 | 4/1976 | Sanoda | 365/203 |
| 3,993,917 | 11/1976 | Kalter | 365/203 |

OTHER PUBLICATIONS

IBM Technical Disclosure Bulletin-vol. 20, No. 5; Oct. 1977 pp. 1714-1715.
IEEE Journal of Solid State Circuits-vol. SC-11, No. 5, Oct. 1976 pp. 596-601.
1977 *IEEE International Solid-State Circuits Conference*, Session I, Feb. 16, 1977; pp. 12-13.
IEEE *Journal of Solid-State Circuits*-vol. SC-13, No. 5, Oct. 1978 pp. 611-616.

*Primary Examiner*—James W. Moffitt
*Attorney, Agent, or Firm*—Kenneth Olsen; Michael Pollock; Warren M. Becker

[57] ABSTRACT

A sense amplifier for determining the binary logic state of a dynamic memory cell ($11_{x,y}$) preamplifies an initial voltage difference established between a first input line ($17_y$) coupled to the memory cell ($11_{x,y}$) and a first reference line ($18_y$) coupled to a reference cell ($32_y$). The resulting amplifies voltage difference is generated between a second input line (19) coupled through a coupling device ($Q51_y$) to the first input line ($17_y$) and a second reference line (20) coupled through another coupling device ($Q52_y$) to the first reference line ($18_y$) by capacitively charging the second lines (19 and 20) preferably with a pair of capacitors (C61 and C62) individually coupled to the second lines (19 and 20). A differential sensing device (90) senses the amplified voltage difference to determine the logic state which is fully restored to the memory cell ($11_{x,y}$).

23 Claims, 5 Drawing Figures

SENSE AMPLIFIER AND SENSING METHODS

BACKGROUND OF THE INVENTION

1. Field of the Invention

This invention relates to semiconductor memories and circuitry associated therewith. More particularly, this invention relates to sense amplifiers for determining the logic states of dynamic memory cells and to methods for sensing such logic states.

2. Description of the Prior Art

Several types of sense amplifiers have been suggested for determining the logic states of memory cells in metal-oxide semiconductor (MOS) dynamic memories. In U.S. Pat. No. 3,514,765, A. O. Christensen discloses a basic sense amplifier utilizing a pair of cross-coupled MOS field-effect transistors (FET's) which operate in a racing mode to sense either a binary low logic state or a binary high logic state in a dynamic memory cell. S. Wahlstrom discloses another such sense amplifier in U.S. Pat. No. 3,678,473. The sensitivity of a sense amplifier depends on the voltage difference supplied to the cross-coupled FET's. In the sense amplifiers of Christensen and Wahlstrom, this voltage difference is often so small as to cause errors. These prior art devices also do not include any means for restoring the logic state to the memory cell.

L. G. Heller et al. disclose a dynamic sense amplifier in which an initial voltage difference indicative of the logic state of a dynamic memory cell is pre-amplified before being sensed by a pair of cross-coupled FET's in "High Sensitivity Charge-Transfer Sense Amplifier," *IEEE J. of Solid-state Circuits*, vol. SC-11, no. 5, October 1976, pp. 596–601. The prior art device of Heller et al. provides high sensitivity and also restores the sensed logic state but, however, is extremely slow and requires multiple external power supplies making the device impractical.

SUMMARY OF THE INVENTION

In acordance with the invention, a sense amplifier for determining the binary logic state of a memory cell pre-amplifies an initial voltage difference by capacitive charging to generate an amplified voltage difference. The sense amplifier then differentially senses the amplified voltage difference to determine the logic state and fully restores the logic state to the memory cell.

A first input line is coupled to the memory cell which initially contains a storage charge indicative of the logic state. A first reference line is coupled to a reference cell initially containing a reference charge. While the memory and reference cells are isolated from the first lines, a voltage charging system charges them to a specified pre-charge voltage. The initial voltage difference is then established between the first input and first reference lines by opening them to the memory and reference cells, respectively. The sign of the initial voltage difference indicates whether the logic state is a low or a high logic state.

A first coupling device is operable to couple the first input line to a second input line. Likewise, a second coupling device is operable to couple the first reference line to a second reference line. Each coupling device is preferably a field-effect transistor. A capacitive charging system is coupled to the second lines for producing the amplified voltage difference between them. Preferably, the capacitive charging system comprises a pair of capacitors individually coupled to the second lines and to which a pre-amplification clocking signal is applied. The second lines are further coupled to cross-coupled transistors in a differential sensing device which senses the amplified voltage difference.

In a preferred mode of operation, the initial voltage difference is further transferred to the second lines by operating the coupling devices to connect the input lines to each other and to connect the reference lines to each other as the memory and reference cells are appropriately opened to the first lines. Next, the coupling devices are operated to isolate the input lines from each other and to isolate the reference lines from each other. The capacitive charging system then charges the second lines to pre-amplify the initial voltage difference by charge sharing.

An important feature of the invention is that the logic state is restored to the memory cell at the end of the sensing operation. More importantly, the restored low or high logic state is a full logic state even when the initial logic state is degraded.

In another aspect of the invention, a reference cell for a sense amplifier employable with a dynamic memory comprises a reference capacitor coupled between a voltage source and a node, a transistor having its current-conducting electrodes coupled between the node and one bit-line section coupled to one or more memory cells, and another transistor having its current-conducting electrodes coupled between the node and another bit-line section coupled to one or more other memory cells. A control signal is applied to the transistor current-control electrodes for accessing the reference cell. Preferably, the transistors are field-effect devices. In contrast to conventional sense amplifiers having one reference cell for each bit-line section, the present reference cell is shared between two bit-line sections.

In still another aspect of the invention, a precharge system for a sense amplifier employable with a dynamic memory having one or more memory cells coupled to one bit-line section and one or more other memory cells coupled to another bit-line section contains a transistor having its current-conducting electrodes coupled between the bit-line sections for equalizing voltage on a pair of lines coupled to a differential sensing device. The equalizing transistor is preferably a field-effect device. Laying out this pre-charge system is very convenient in the dynamic memory.

BRIEF DESCRIPTION OF THE DRAWINGS

Like reference symbols are employed in the drawings to represent the same item or items in the drawings and in the description of the preferred embodiments.

DESCRIPTION OF THE PREFERRED EMBODIMENTS

Figure 1:
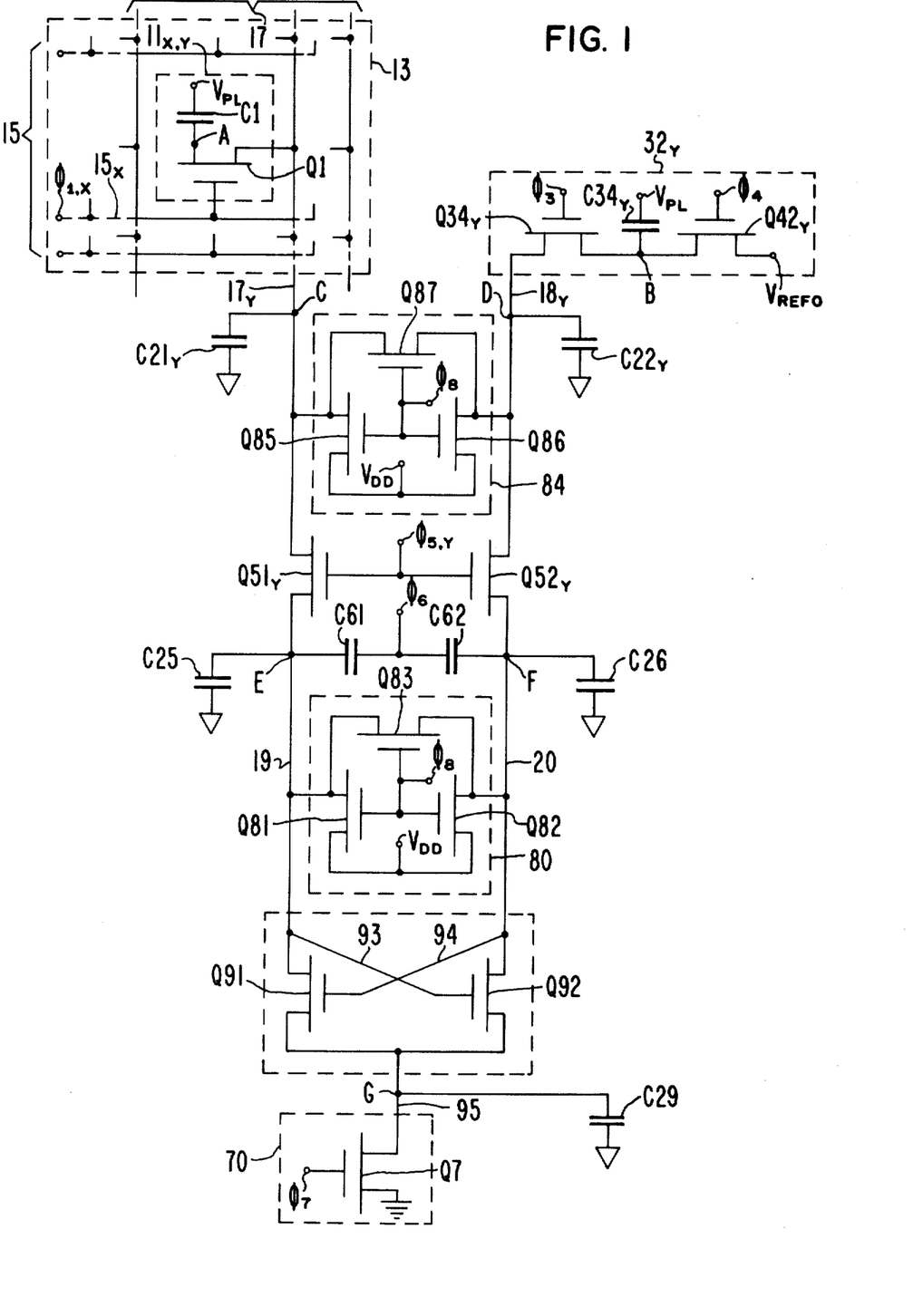
FIG. 1 is an embodiment of the sense amplifier in accordance with the invention for determining the logic state of a memory cell in a dynamic memory.

Referring to the drawings, FIG. 1 illustrates an embodiment of a sense amplifier according to the invention for determining the logic state of a memory (or storage) cell $11_{X,Y}$ which exists either in a binary low logic state or in a binary high logic state. Memory cell $11_{X,Y}$ comprises a capacitor C1 coupled between a plate voltage source $V_{PL}$ and a one source-drain electrode of a metal-oxide semiconductor (MOS) field-effect transistor (FET) Q1 which serves as a gate for accessing capacitor C1. Cell $11_{X,Y}$ is in the low logic or binary "0" state when the voltage at a node A between capacitor C1 and the first source-drain electrode of access FET Q1 is approximately zero volts. Cell $11_{X,Y}$ is in the high logic or binary "1" state when the voltage at node A approximately equals a voltage $V_{DD}$ which has a high value in absolute magnitude. Opposite definitions could be adopted as well.

Memory cell $11_{X,Y}$ forms part of a dynamic random-access memory 13 comprising a plurality of cells of the type of memory cell $11_{X,Y}$ arranged in an array of M rows and N columns. X, a positive integer varying from 1 to M, indicates a particular row, Y, a positive integer varying from 1 to N, indicates a particular column. The cells of memory 13 are accessed along M word lines 15 corresponding to the M rows, the memory cells in each row being coupled to the corresponding word line 15 for that row. Word line $15_X$ of lines 15 is coupled to the gate electrode of access FET Q1. A word-line clocking signal (clock) $\phi_{1,X}$ is applied (through an appropriate terminal connection) to word line $15_X$ for accessing cell $11_{X,Y}$. The logic states of the memory cells in memory 13 are sensed along N bit lines (or bit-line sections) 17 corresponding to the N column, the memory cells in each column being coupled to the corresponding bit line 17 for that column. The logic state of cell $11_{X,Y}$ is specifically sensed along a bit line $17_Y$ coupled to the other source-drain electrode of FET Q1.

The present sense amplifier, which generally comprises the circuitry illustrated in FIG. 1 excluding memory 13, is employed to determine the logic states of all memory cells along bit line $17_Y$. Other similar sense amplifiers may be utilized to determine the logic states of memory cells along others of lines 17.

Associated with cell $11_{X,Y}$ and the other memory cells along bit line $17_Y$ (often hereafter referred to as upper input line $17_Y$) is a reference cell $32_Y$ and an upper reference line $18_Y$. Reference cell $32_Y$ comprises a a capacitor $C34_Y$ coupled between voltage source $V_{PL}$ and one source-drain electrode of an MOS FET $Q34_Y$ having its other source-drain electrode coupled to upper reference line $18_Y$. FET $Q34_Y$ acts as a gate for accessing capacitor $C34_Y$. A clocking signal (clock) $\phi_3$ is applied (through an appropriate terminal connection) to the gate electrode of FET $Q34_Y$ to access cell $23_Y$. Cell $32_Y$ is in a quiescent state when the voltage at a node B between capacitor $C34_Y$ and the first source-drain electrode of FET $Q34_Y$ is approximately a voltage $V_{REF0}$ which preferably is near ground potential. This voltage is provided from a voltage source $V_{REF0}$ coupled across the source-drain electrodes of an MOS FET $Q42_Y$ by way of node B to capacitor $Q34_Y$. A clocking signal (clock) $\phi_4$ is applied (through an appropriate terminal connection) to the gate electrode of FET $Q42_Y$ for adjusting the voltage at node B to voltage $V_{REF0}$. Alternatively, FET $Q42_Y$ and voltage source $V_{REF0}$ may be eliminated by allowing capacitor $C34_Y$ to be set by FET $Q34_Y$ and clock $\phi_3$.

Upper input line $17_Y$ is coupled through the source-drain electrodes of an MOS FET $Q51_Y$ to a lower input line 19. Likewise, upper reference line $18_Y$ is coupled through the source-drain electrodes of an MOS FET $Q52_Y$ to a lower reference line 20. A coupler clocking signal (clock) $\phi_{5,Y}$ is applied (through appropriate terminal connections) to the gate electrodes of coupling FET's $Q51_Y$ and $Q52_Y$.

Capacitors $C21_Y$ and $C22_Y$ represent the lumped parasitic capacitances associated with lines $17_Y$ and $18_Y$, respectively, as well as any actual capacitor (s) connected between lines $17_Y$ and $18_Y$, respectively, and a constant reference potential. Capacitors C25 and C26 represent the lumped parasitic capacitances associated with lines 19 and 20, respectively, as well as any actual capacitor (s) connected between lines 19 and 20, respectively, and the constant reference potential.

A capacitor C61 is coupled between line 19 and an appropriate input terminal connection at which a preamplification (pre-amp) clocking signal (clock) $\phi_6$ is applied. Similarly, a capacitor C62 is coupled between line 20 and an appropriate input terminal connection at which pre-amp clock $\phi_6$ is applied.

When clock $\phi_6$ changes, the voltages on lines 19 and 20 change correspondingly due to capacitive charge sharing. In particular, charge sharing between capacitors C61 and C25 causes the voltage at a node E on line 19 to increase (decrease) as clock $\phi_6$ increases (decreases). Likewise, charge sharing between capacitors C62 and C26 causes the voltage at a node F on line 20 to increase (decrease) as clock $\phi_6$ increases (decreases). If coupling FET $Q51_Y$ is on when clock $\phi_6$ changes, further charge sharing occurs with capacitor $C21_Y$ to change the voltage at a node C on line $17_Y$. Similarly, further charge sharing occurs with capacitor $C22_Y$ to change the voltage at a node D on line $18_Y$ if coupling FET Q52 is conducting when clock $\phi_6$ changes.

On the other hand, by turning FET $Q51_Y$ off to isolate line 19 from $17_Y$, the voltages at nodes C and E are adjustable independently of each other. By turning FET $Q52_Y$ off to isolate line 20 from line $18_Y$, the voltages at nodes D and F are adjustable independently of each other.

Furthermore, when FET's $Q51_Y$ and $Q52_Y$ are each biased to operate in the saturation region at the edge of the on/off transition point, each FET $Q51_Y$ or $Q52_Y$ acts as a diode having its cathode connected to line $17_Y$ or $18_Y$, respectively, where the diode does not transmit a voltage in excess of the gate voltage minus the threshold voltage. Lines 19 and 20 are thereby substantially self isolated from lines $17_Y$ and $18_Y$, respectively, so that the voltages at nodes E and F are adjustable without substantially affecting the voltages at nodes C and D.

Lines 19 and 20 are coupled to a differential sensing device 90 which senses the voltage difference between nodes E and F and, as explained below, determines the logic state of memory cell $11_{X,Y}$. Differential sensing device 90 comprises a pair of cross-coupled MOS FET's Q91 and Q92. FET Q91 has its gate electrode coupled by a line 94 to line 20 and its source-drain electrodes coupled between line 19 and a discharge line 95. FET Q92 has its gate electrode coupled by a line 93 to line 19 and its source-drain electrodes coupled between line 20 and line 95. A capacitor C29 represents the lumped parasitic capacitance associated with line 95 as well as any actual capacitor (s) connected between line 95 and the constant reference potential. Charge sharing among capacitor C29 and capacitors along line 17$_Y$ or 18$_Y$ affects the voltage on line 95 at a node G if FET Q91 or FET Q92, respectively, is conducting when pre-amp clock $\phi_6$ changes.

Accordingly, when the total charge carried by memory cell 11$_{X,Y}$ and the composite input line 17$_Y$ and 19 differs from the total charge carried by reference cell 32$_Y$ and the composite reference line 18$_Y$ and 20, capacitors C61 and C62 in combination with FET's Q51 and Q52 and with FET's Q91 and Q92 if either is on provide a capability for establishing a voltage difference between lines 17$_Y$ and 18$_Y$, at least partially isolating lines 19 and 20 from lines 17$_Y$ and 18$_Y$, and then amplifying (or pre-amplifying) the voltage difference on lines 19 and 20.

An optimized discharging control device 70 is coupled by line 95 to sensing device 90 for controlling its operation. Discharging control device 70 comprises an MOS FET Q7 having its source-drain electrodes coupled between line 95 and ground reference. A discharging control clocking signal (clock) $\phi_7$ is applied (through an appropriate terminal connection) to the gate electrode of FET Q7. When clock $\phi_7$ is adjusted to a voltage that places FET Q7 in the conducting mode, a current path to ground is provided through the source-drain electrodes of transistor Q7 and along line 95 to activate sensing device 90. When memory cell 11$_{X,Y}$ contains a "0", the left-hand side of the sense amplifier—i.e., the side having lines 17$_Y$ and 19 and FET's Q51$_Y$ and Q91—discharges through this current path, and sensing device 90 latches with FET Q91 on and FET Q92 off. On the other hand, when cell 11$_{X,Y}$ contains a "1," the right-hand side of the sense amplifier—i.e., the side having lines 18$_Y$ and 20 and FET's Q52$_Y$ and Q92—discharges through this conducting path, and sensing device 90 latches with FET Q92 on and FET Q91 off.

Not shown in FIG. 1 is a device (circuitry) for transmitting the latched state of sensing device 90 to an output read circuit.

An "inside" pre-charge device 80 is coupled between lines 19 and 20 for charging lines 19 and 20 to a selected voltage and also for charging lines 17$_Y$ and 18$_Y$ to the selected voltage. Pre-charge device 80 comprises an MOS FET Q81 having its source-drain electrodes coupled between line 19 and a voltage source V$_{DD}$ and an MOS FET Q82 having its source-drain electrodes coupled between line 20 and voltage source V$_{DD}$. A pre-charge clocking signal (clock) $\phi_8$ is applied (through appropriate terminal connections) to the gate electrodes of FET's Q81 and Q82. When pre-charge clock $\phi_8$ is appropriately adjusted to place FET's Q81 and Q82 in the conducting mode, lines 19 and 20 charge to voltage V$_{DD}$, and, when FET's Q51$_Y$ and Q52$_Y$ are conducting, lines 17$_Y$ and 18$_Y$ charge to voltage V$_{DD}$, which is the selected voltage in this case. Clock $\phi_8$ is also applied (through an appropriate terminal connection) to the gate electrode of an optional MOS FET Q83 having its source-drain electrodes coupled between lines 19 and 20. When included in pre-charge device 80, FET Q83 serves to equalize the voltages at nodes E and F and at nodes C and D as well if FET's Q51$_Y$ and Q52$_Y$ are conducting.

An "outside" pre-charge device 84 is coupled between line 17$_Y$ and 18$_Y$ for charging lines 17$_Y$, 18$_Y$, 19, and 20 to the selected voltage. Pre-charge device 84 comprises a pair of MOS FET's Q85 and Q86 connected in the same manner as FET's Q81 and Q82. An optional MOS FET Q87, which is connected in the same manner as FET Q83, likewise serves to equalize the voltages at nodes C, D, E, and F.

Ideally, the present sense amplifier includes both pre-charge devices 80 and 84. In this ideal case, lines 17$_Y$, 18$_Y$, 19, and 20 are charged to voltage V$_{DD}$ without the necessity of placing FET's Q51$_Y$ and Q52$_Y$ in the conducting mode. Realistically, it is usually preferable to use either inside pre-charge device 80 or outside precharge device 84, but not both, so as to reduce the number of transistors needed.

The transistors illustrated in FIG. 1 and described above may be either N-channel or P-channel devices. In a particular embodiment, the FET's of the present sense amplifier as well as the FET's employed in memory cells 11$_{X,Y}$ are usually all of the same channel type. Where the transistors are all N-channel FET's, voltage source V$_{DD}$ is a positive voltage source, voltage source V$_{PL}$ is greater than or equal to ground potential, and conventional positive logic is employed in correlating the logic states of cell 11$_{X,Y}$ with changes in the voltage at node A. Where the transistors are all P-channel FET's, voltage source V$_{DD}$ is a negative voltage source, voltage source V$_{PL}$ is less than or equal to ground potential, and standard negative logic is employed in correlating the logic states of cell 11$_{X,Y}$ with changes in the voltage at node A.

With the exception of FET's Q51$_Y$ and Q52$_Y$, the transistors in the sense amplifier described above and shown in FIG. 1 are all generally enhancement-mode devices, although depletion-mode devices might conceivably be used in some instances. If the highest magnitude of clock $\phi_{5,Y}$ exceeds the greatest absolute voltage transmitted through FET's Q51$_Y$ and Q52$_Y$ by at least the absolute value of the enhancement-mode threshold voltage, FET's Q51$_Y$ and Q52$_Y$ may generally be enhancement-mode devices. Otherwise, FET's Q51$_Y$ and Q52$_Y$ are generally depletion-mode devices.

Figure 2:
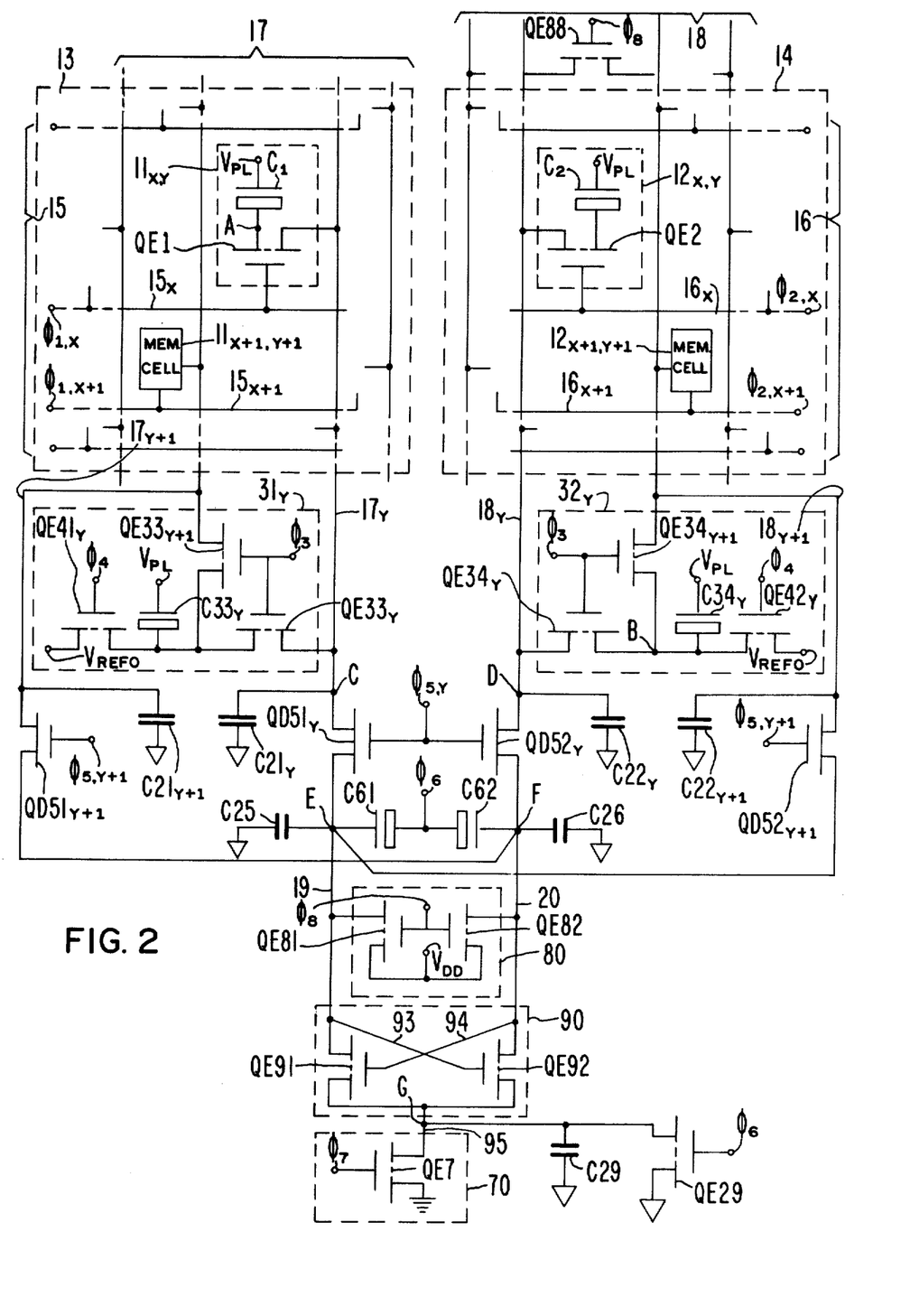
FIG. 2 is an embodiment of the sense amplifier according to the invention for interrogating memory cells coupled to multiple bit-line sections in a dynamic memory.

FIG. 2 shows a preferred embodiment of the sense amplifier of FIG. 1. The sense amplifier of FIG. 2 includes additional transistors and other elements beyond those described above for FIG. 1 for sensing the logic states of other memory cells akin to cell 11$_{X,Y}$. The notation "QE" before a number indicates that the referenced term is an enhancement-mode FET, and the notation "QD" before a number indicates that the referenced item is a depletion-mode FET. Each transistor shown in FIG. 2 preferably is an N-channel device.

FET Q1 of memory cell 11$_{X,Y}$ is an enhancement-mode device QE1 in FIG. 2. Reference cell 32$_Y$ is again employed to determine the logic state of each cell 11$_{X,Y}$ along line 17$_Y$ in memory 13. FET's Q34$_Y$ and Q42$_Y$ are enhancement-mode devices QE34$_Y$ and QE42$_Y$, respectively, in FIG. 2.

The sense amplifier of FIG. 2 also determines the logic state of each memory cell along another bit line in memory 13 in rows not containing a memory cell 11$_{X,Y}$ specifically coupled to line 17$_Y$. Bit (or upper input) line 17$_{Y+1}$ of lines 17 is exemplary of this other bit line, and memory cell 11$_{X+1,Y+1}$, which is otherwise identical to cell 11$_{X,Y}$, indicates one of the memory cells coupled to line 17$_{Y+1}$. A clocking signal (clock) $\phi_{1,X+1}$ is applied (through an appropriate terminal connection) to a word line 15$_{X+1}$ of word lines 15 for accessing cell 11$_{X+1,Y+1}$. In the embodiment shown in FIG. 2, the sense amplifier interrogates the memory cells along line 17$_Y$ in alternate rows and the memory cells along line $17_{Y+1}$ in the remaining (and therefore also alternate) rows. No memory cells are located, for example, at the row X, column Y+1 position and at the row X+1, column Y position.

Associated with cell $11_{X+1,Y+1}$ and the other memory cells along upper input line $17_{Y+1}$ is reference cell $32_Y$ and an upper reference line $18_{Y+1}$. Reference cell $32_Y$ therefore acts as a composite reference cell for both memory cell $11_{X,Y}$ on line $17_Y$ and memory cell $11_{X+1,Y+1}$ on line $17_{Y+1}$. Reference cell $32_Y$ further includes an enhancement-mode MOS FET $QE34_{Y+1}$ having its source-drain electrodes coupled between line $18_{Y+1}$ and node B. Clock $\phi_3$ is applied (through an appropriate terminal connection) to the gate electrode of FET $QE34_{Y+1}$ so that it acts as a gate for accessing capacitor $C34_Y$.

Preferably, capacitor $C34_Y$ has a physical size approximately equal to that of capacitor C1 in memory cell $11_{X,Y}$. Use of such a "full-size" reference capacitor instead of the conventional reference capacitor which is approximately half size eases the normal practical geometric mask layout limitations in MOS technology. Since reference cell $32_Y$ is shared with both lines $18_Y$ and $18_{Y+1}$, only about half of the total charge supplied to capacitor $C34_Y$ when cell $32_Y$ is accessed is provided from line $18_Y$ when memory cell $11_{X,Y}$ is being read. Consequently capacitor $C34_Y$ has an effective capacitance of approximately one half its actual capacitance.

In the same manner as with memory 13, the sense amplifier of FIG. 2 further determines the logic state of each memory cell $12_{X,Y}$ along line $18_Y$ of N bit lines (or bit-line sections) 18 on alternate rows and the logic state of each memory cell $12_{X+1,Y+1}$ along line $18_{Y+1}$ of lines 18 on the remaining (alternate) rows in a corresponding memory 14. Lines $18_Y$ and $18_{Y+1}$ serve as bit (or upper input) lines for memory 14. Cell $12_{X,Y}$, which comprises a capacitor C2 and an enhancement-mode MOS FET QE2 connected in the same manner as capacitor C1 and FET QE1 of cell $11_{X,Y}$, and cell $12_{X+1,Y+1}$ are each otherwise identical to cell $11_{X,Y}$. Clocking signals (clocks) $\phi_{2,X}$ and $\phi_{2,X+1}$ are applied (through appropriate terminal connections) to word lines $16_X$ and $16_{X+1}$, respectively, of M word lines 16 for accessing cells $12_{X,Y}$ and $12_{X+1,Y+1}$, respectively.

Associated with the memory cells coupled to lines $18_Y$ and $18_{Y+1}$ (which serve here as upper reference lines) in memory 14 is a composite reference cell $31_Y$ coupled to lines $17_Y$ and $17_{Y+1}$, respectively. Cell $31_Y$ comprises enhancement-mode MOS FET's $QE33_Y$, $QE33_{Y+1}$, and $QE41_Y$ and capacitor $C33_Y$ connected in the same manner as FET's $QE34_Y$, $QE34_{Y+1}$, and $QE42_Y$ and capacitor $C34_Y$, respectively, of cell $32_Y$.

The sense amplifier in the preferred embodiment of FIG. 2 generally comprises the illustrated circuitry excluding memories 13 and 14 which each form one half of a composite dynamic random-access memory 13 and 14. Other similar sense amplifiers may be employed to interrogate the other memory cells of composite memory 13 and 14.

Coupling transistors $Q51_Y$ and $Q52_Y$ are depletion-mode devices $QD51_Y$ and $QD52_Y$, respectively, in FIG. 2. The source-drain electrodes of a depletion-mode MOS FET $QD51_{Y+1}$ are coupled between lines $17_{Y+1}$ and 20. The source-drain electrodes of a depletion-mode MOS FET $QD52_{Y+1}$ are coupled between lines $18_{Y+1}$ and 19. A coupler clocking signal (clock) $\phi_{5,Y+1}$ is applied (through appropriate terminal connections) to the gate electrodes of FET's $QD51_{Y+1}$ and $QD52_{Y+1}$.

Capacitors $C21_{Y+1}$ and $C22_{Y+1}$ represent the capacitances associated with lines $17_{Y+1}$ and $18_{Y+1}$, respectively.

Cross-coupled FET's Q91 and Q92 of sensing device 90 are enhancement-mode devices QE91 and QE92 in FIG. 2 Coupler clock $\phi_6$ is further applied to the gate electrode of an optional enhancement-mode MOS FET QE29 having its source-drain electrode coupled between line 95 and the constant reference potential. FET QE29 damps the voltage change at node G when clock $\phi_6$ rises. This increases the effective capacitance of capacitor C29. FET Q7 in discharging device 70 is an enhancement-mode device QE7 in FIG. 2.

Only inside pre-charge device 80 is employed in the preferred embodiment of FIG. 2. FET's Q81 and Q82 of pre-charge device 80 are enhancement-mode devices QE81 and QE82, respectively. The optional equalizing device corresponding to FET Q83 is not included.

Instead, an enhancement-mode MOS FET QE88 having its source-drain electrode coupled between lines $18_Y$ and $18_{Y+1}$ is employed to achieve pre-charge voltage equalization. Pre-charge clock $\phi_8$ is applied (through an appropriate terminal connection) to the gate electrode of FET QE88. The voltages on lines $17_Y$, $18_Y$, 19, and 20 are equalized by turning on FET QE88 with clock $\phi_8$ and manipulating clocks $\phi_{5,Y}$ and $\phi_{5,Y+1}$ so as to turn on FET's $QD51_Y$, $QD52_Y$, and $QD52_{Y+1}$, thereby connecting line $18_{Y+1}$ to line $17_Y$. Since this action also turns on FET $QD51_{Y+1}$, lines $17_{Y+1}$ and $18_{Y+1}$ are likewise equalized at the desired voltage ($V_{DD}$).

In the preferred embodiment of FIG. 2, each enhancement-mode FET has a threshold voltage $V_{TE}$ of 0.7–0.8 volt. Each depletion-mode FET has a threshold voltage of $V_{TD}$ of approximately $-3.5$ to $-2.5$ volts. Voltage sources $V_{PL}$, $V_{DD}$, and $V_{REFO}$ are 7 volts, 5.0 volts, and zero volts, respectively. Each of capacitors C1, C2, $C33_Y$, $C34_Y$, C61, and C62 is an MOS FET having its source-drain electrodes connected to each other. Capacitors C61 and C62 are enhancement-mode devices, in particular. Capacitors C1 and C2 each have a capacitance $C_{MC}$ of about 0.05 picofarad. Capacitors $C34_Y$ and $C34_{Y+1}$ each have an actual capacitance approximately equal to capacitance $C_{MC}$ and therefore an effective capacitance $C_{RC}$ about one-half of capacitance $C_{MC}$. Capacitors $C21_Y$, $C22_Y$, $C21_{Y+1}$, and $C22_{Y+1}$ each have a capacitance $C_{UL}$ about ten to fifteen times capacitance $C_{MC}$. Capacitors C25 and C26 each have a capacitance $C_{LL}$ about 0.5 to 1.0 times capacitance $C_{MC}$. Capacitors C61 and C62 each have a capacitance $C_{PA}$ of about 0.1 picofarad. Capacitor C29 when used with FET QE29 has an effective capacitance $C_{DL}$ of 0.2–0.5 picofarad (per sense amplifier), The sensing functions of the sense amplifier of FIG. 2 are allocated as follows. The coupling pair $QD51_Y$ and $QD52_Y$, the sensing pair QE91 and QE92, and the capacitor pair C61 and C62 are employed in interrogating each memory cell $11_{X,Y}$ on line $17_Y$. The same pairs $QD51_Y$ and $QD52_Y$, QE91 and QE92, and C61 and C62 are utilized in reading each memory cell $12_{X,Y}$ on line $18_Y$. Lines $17_Y$ and $18_Y$ thus form a composite bit line associated with a distinct section of composite memory 13 and 14. Similarly, the coupling pair $QD51_{Y+1}$ and $QD52_{Y+1}$, the sensing pair QE91 and QE92, and the capacitor pair C61 and C62 are employed in reading each memory cell on lines $17_{Y+1}$ and $18_{Y+1}$ which thus also form a composite bit line.

The present sense amplifier can be extended to interrogate memory cells coupled to further bit lines in a memory such as composite memory 13 and 14 by adding further coupling transistors (e.g., QD51$_{Y+1}$ and QD52$_{Y+1}$) and reference-cell access transistors (e.g., QE33$_{Y+1}$ and QE34$_{Y+1}$) in the same manner by which the sense amplifier of FIG. 1 expanded to that of FIG. 2.

Figure 3A:
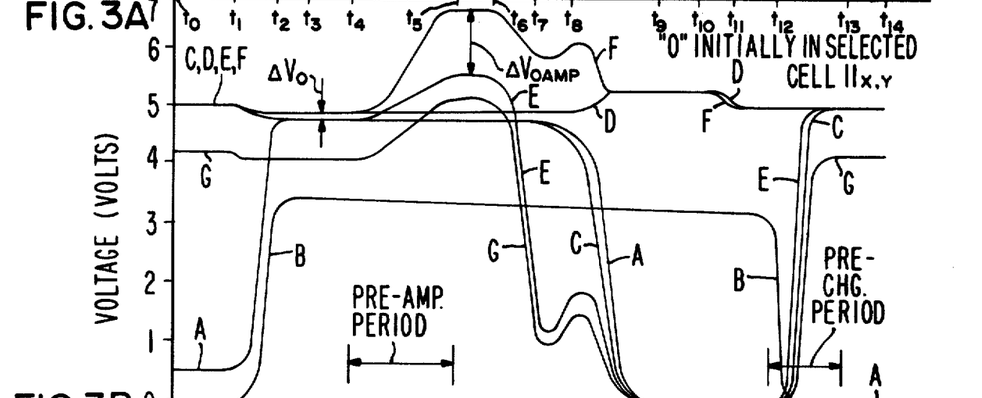
FIGS. 3a, 3b, and 3c are waveforms of clocking signals and selected voltages for a preferred mode of operation of the sense amplifier of FIG. 2 and also useful in understanding the operation of the sense amplifier of FIG. 1.
Figure 3B:
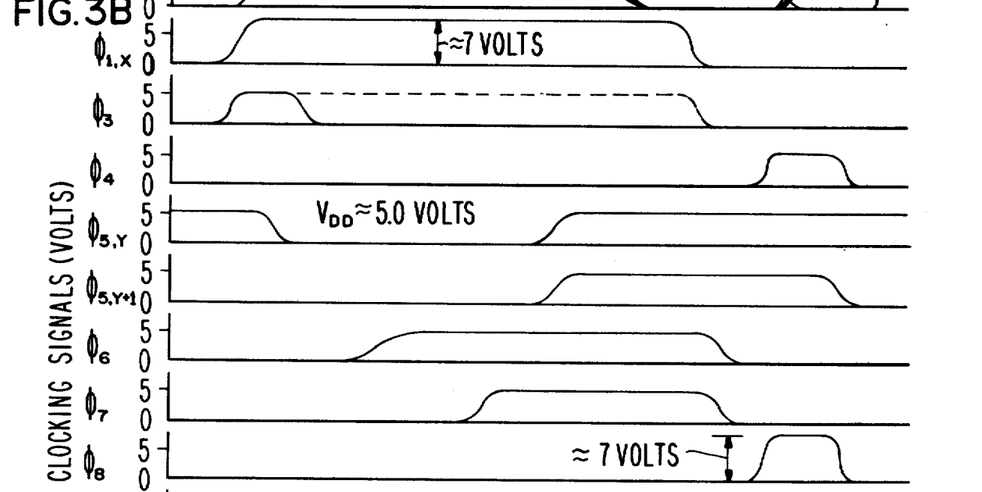
Figure 3C:
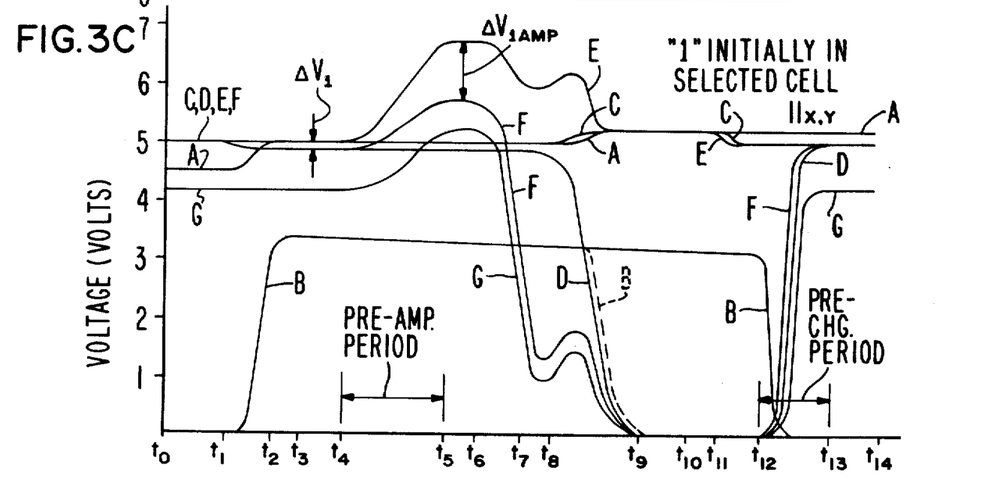

FIGS. 3a, 3b, and 3c show examples of waveforms useful in understanding a preferred mode of operation of the sense amplifier depicted in FIGS. 1 and 2. This preferred mode will be specifically described with respect to FIG. 2 for interrogating memory cell 11$_{X,Y}$ in conjunction with reference cell 32$_Y$. Accordingly, this preferred mode generally applied to FIG. 1 for the case where the elements of FIGS. 1 and 2 coincide. By appropriately manipulating clocks $\phi_{1,X+1}$, $\phi_{2,X}$, $\phi_{2,X+1}$, $\phi_{5,Y}$, and $\phi_{5,Y+1}$, this preferred mode similarly applied to sensing the logic state of memory cell 11$_{X+1,Y+1}$, 12$_{X,Y}$, or 12$_{X+1,Y+1}$, respectively.

The waveforms in FIG. 3a deal with the case where a low logic state is being sensed in memory cell 11$_{X,Y}$. The waveforms in FIG. 3c indicate the case in which a high logic state is being sensed. The letters A, B, C, D, E, F, and G in FIGS. 3a and 3c indicate the voltages at nodes A, B, C, D, E, F, and G, respectively.

The waveforms in FIG. 3b represent clocks $\phi_{1,X}$, $\phi_3$, $\phi_4$, $\phi_{5,Y}$, $\phi_{5,Y+1}$, $\phi_6$, $\phi_7$, and $\phi_8$ for sensing either a low or high logic state. The time scale for FIG. 3b is that shown for either FIG. 3a or FIG. 3c. The high value of each clock shown is voltage V$_{DD}$ except for clocks $\phi_{1,X}$ and $\phi_8$ whose high value is about 2 volts more (i.e., over a threshold voltage V$_{TE}$ greater than voltage V$_{DD}$). The low value of each clock shown is zero volts.

As the preferred mode of operation begins, the voltage at node A in memory cell 11$_{X,Y}$ has either an initial value V$_0$ if a "0" is being read or an initial value V$_1$ if a "1" is being read. A full "1" approximately equals 5.0 volts (i.e., voltage V$_{DD}$ rather than higher voltage V$_{PL}$ since the voltage at node A is limited by the normal high voltage on line 17$_Y$ of about voltage V$_{DD}$). A full "0" is zero volts. For the cases shown in FIGS. 3a and 3c, initial value V$_0$ is 0.5 volt which represents a slightly "degraded" low logic state—i.e., a "0" degraded by 0.5 volt. Initial value V$_1$ is 4.5 volts representing a slightly "degraded" high logic state—i.e., a "1" degraded by 0.5 volt.

Operation normally begins by activating pre-charge device 80 and FET QE88 to charge composite input line 17$_Y$ and 19 and composite reference line 18$_Y$ and 20 to the desired voltage (V$_{DD}$ here). Because a number of initial conditions may exist from the immediate prior sensing operation, pre-charging of line 17$_Y$ and 19 and line 18$_Y$ and 20 is illustrated in FIGS. 3a–3c at a time after cell 11$_{X,Y}$ has been interrogated and thus as part of the following sensing operation. Accordingly, by initial time $t_0$, nodes A, B, C, and D have been pre-charged to voltage V$_{DD}$. Node G on line 95 has also risen to about a threshold voltage V$_{TE}$ below voltage V$_{DD}$ during the pre-charge period.

At time $t_0$ after the pre-charge period, clocks $\phi_1$, $\phi_3$, $\phi_4$, $\phi_{5,Y+1}$, $\phi_6$, $\phi_7$, and $\phi_8$ are all low. Consequently, FET QE1 is off, isolating memory cell 11$_{X,Y}$ from the sense amplifier; FET's QE34$_Y$ and QE34$_{Y+1}$ (and QE33$_Y$ and QE33$_{Y+1}$) are off, isolating reference cell 32$_Y$ (and cell 31$_Y$) from sensing device 90; FET QE42$_Y$ in cell 32$_Y$ is off, isolating node B from voltage V$_{REF0}$; FET's QD51$_{Y+1}$ and QD52$_{Y+1}$ are off, isolating lines 17$_{Y+1}$ and 18$_{Y+1}$ from sensing device 90 and further isolating cell 31$_Y$ (and cell 32$_Y$) from sensing device 90; FET QE7 in control device 70 is off, isolating node G from ground reference; and FET's QE81, QE82, QE88, are off so that pre-charge device 80 is deactivated. FET's QE91 and QE92 in sensing device 90 are at the edge of the point where conduction begins and are thus effectively off. Clocks $\phi_{1,X+1}$, $\phi_{2,X}$, and $\phi_{2,X+1}$ are all low, isolating the remainder of composite memory 13 and 14 from the sense amplifier. Only clock $\phi_{5,Y}$ is high, so that FET's QD51$_Y$ and QD52$_Y$ are on, connecting line 17$_Y$ to line 19 and connecting line 18$_Y$ to line 20.

At time $t_1$, a voltage difference $\Delta V$ is established between composite input line 17$_Y$ and 19 and composite reference line 18$_Y$ and 20 by raising clocks $\phi_{1,X}$ and $\phi_3$ to their high values. As clock $\phi_3$ goes high, FET QE34$_Y$ turns on to open (or connect) reference cell 32$_Y$ to reference line 18$_Y$ and 20. FET QE34$_{Y+1}$ also goes on to open cell 32$_Y$ to line 18$_{Y+1}$. Capacitors C22$_Y$, C26, and C62 share with (and provide positive charge to) capacitor C34$_Y$ to drop the voltage at nodes D and F. This drop is about 0.1 volt in FIGS. 3a and 3c. The voltage at node B rises, but no higher than a threshold voltage V$_{TE}$ below clock $\phi_3$. (Node B would rise to voltage V$_{DD}$ if clock $\phi_3$ were adjusted to rise to about 7 volts). By balancing charge, the resulting reference voltage V$_{RH}$ at nodes D and F is $$V_{RH} \approx V_{DD} - \left( \frac{2C_{RC}}{2C_{UL} + C_{LL} + C_{PA}} \right) (V_{DD} - V_{TE}) \quad (1)$$

where voltage V$_{REF0}$ has been taken as zero volts. Further charge sharing along line 18$_{Y+1}$ also drops it to voltage V$_{RH}$.

As word-line clock $\phi_{1,X}$ goes high, FET QE1 turns to open (or connect) memory cell 11$_{X,Y}$ to input line 17$_Y$ and 19. If a "0" is being sensed, capacitors C21$_Y$, C25, and C61 charge share with (and provide positive charge to) capacitor C1 to reduce the voltage at nodes C and E. This reduction is about 0.2 volt in FIG. 3a. The voltage at node A rises from initial value V$_0$ to that at nodes C and E. Node G also drops a small amount which may be neglected here. By balancing charge, the resultant input voltage V$_{LH0}$ at nodes A, C, and E is $$V_{LH0} \approx V_{DD} - \left( \frac{C_{MC}}{C_{UL} + C_{LL} + C_{PA} + C_{MC}} \right) (V_{DD} - V_0) \quad (2)$$

By combining Eqs. (1) and (2), the voltage difference $\Delta V_0$ between input line 17$_Y$ and 19 and reference line 18$_Y$ and 20 is $$\Delta V_0 = V_{LH0} - V_{RH} \approx \quad (3)$$

$$\left( \frac{2C_{RC}}{2C_{UL} + C_{LL} + C_{PA}} \right) (V_{DD} - V_{TE}) -$$

$$\left( \frac{C_{MC}}{C_{UL} + C_{LL} + C_{PA} + C_{MC}} \right) (V_{DD} - V_0)$$

The second term in Eq. (3) is greater in magnitude than the first term since capacitance C$_{MC}$ is on the order of twice as large as capacitance C$_{RC}$ and voltages V$_{TE}$ and V$_0$ are each a small fraction of voltage V$_{DD}$. Accordingly, voltage difference $\Delta V_0$ is negative, which indicates that a "0" is being sensed in memory cell $11_X$. Voltage difference $\Delta V_0$ is about $-0.1$ volt in FIG. 3a.

If a degraded "1" is being sensed as clock $\phi_{1,X}$ goes high at time $t_1$, capacitors $C21_Y$, C61, and C25 charge share with (and provide positive charge to) capacitor C1 to reduce the voltage at nodes A and C by a very small amount. The voltage at node A rises from initial value $V_1$ to that at nodes C and E. If a full "1" rather than a degraded "1" is being sensed, no charge sharing occurs. By balancing charge, the resultant input voltage $V_{LH1}$ at nodes A, C, and E is given generally as $$V_{LH1} \approx V_{DD} - \left(\frac{C_{MC}}{C_{UL} + C_{LL} + C_{PA} + C_{MC}}\right)(V_{DD} - V_1) \quad (4)$$

By combining Eqs. (1) and (4), the resultant voltage difference $\Delta V_1$ between input line $17_Y$ and 19 and reference line $18_Y$ and 20 is $$\Delta V_1 = V_{LH1} - V_{RH} \approx \quad (5)$$

$$\left(\frac{2C_{RC}}{2C_{UL} + C_{LL} + C_{PA}}\right)(V_{DD} - V_{TE}) -$$

$$\left(\frac{C_{MC}}{C_{UL} + C_{LL} + C_{PA} + C_{MC}}\right)(V_{DD} - V_1)$$

The first term in Eq. (5) is greater in magnitude than the second because the factor $(V_{DD} - V_1)$ is small. Accordingly, voltage difference $V_1$ is positive, which indicates that a "1" is being sensed. Voltage difference $V_1$ is about 0.1 volt in FIG. 3c.

At time $t_2$, coupler clock $\phi_{5,Y}$ goes low to turn off FET's $QD51_Y$ and $QD52_Y$. This isolates node C from node E and isolates node D from node F. FET's $QD51_Y$ and $QD52_Y$ therefore act as switching devices to isolate (or disconnect) lines $17_Y$ and 19 from each other and to isolate lines $18_Y$ and 20 from each other.

At time $t_3$, clock $\phi_3$ goes low to turn off FET $QE34_Y$ (and also FET $QE34_{Y+1}$), thereby isolating reference cell $32_Y$ from line $18_Y$ and the remainder of the sense amplifier. The voltage at node B then remains substantially constant until the next pre-charge period.

Alternatively, clock $\phi_3$ may be held at its high value during the remainder of the sensing cycle. In this case, FET $QE34_{Y+1}$ is deleted from reference cell $32_Y$, and a separate reference cell is added for memory cell $11_{X+1,Y+1}$. If a "0" is being sensed, waveform B is substantially the same as that shown for the principal case since the voltage at node B is limited by clock $\phi_3$. However, if a "1" is being sensed, employing this alternative causes node B to drop to zero volts when node D drops to zero volts during the primary sensing action. This alternative is indicated by the dashed-line portions for clock $\phi_3$ in FIG. 3b and for waveform B in FIG. 3c.

With lines 19 and 20 isolated from lines $17_Y$ and $18_Y$, respectively, voltage difference $\Delta V$ (i.e., either $\Delta V_0$ or $\Delta V_1$) is amplified (or pre-amplified) beginning at time $t_4$ by raising pre-amp clock $\phi_6$ up to its high value to lower the charge on capacitors C61 and C62. An amplified voltage difference $\Delta V_{AMP}$ is thereby generated between lines 19 and 20—i.e., between nodes E and F. Clock $\phi_6$ goes high in such a manner as to minimize a race condition between FET's $QE91_Y$ and $QE92_Y$ in sensing device 90. FET $QE29$ also turns on to increase the capacitance of capacitor C29 from its quiescent value to $C_{DL}$.

Where a "0" is being read as clock $\phi_6$ goes high during the pre-amp period, node F (line 20) rises above its pre-charge voltage ($V_{DD}$) causing FET QE91 in sensing device 90 to turn on first. Nodes E (line 19) and G (line 95) also rise, but not as much as node F. Ideally, node E does not rise faster than node G so that node E is not more than a threshold voltage $V_{TE}$ above node G; accordingly, FET QE92 in sensing device 90 remains off. This situation is illustrated in FIG. 3a. In the most ideal case, nodes E and G equalize, leaving no voltage differential across FET QE91. Charge sharing occurs between capacitors C26 and C62 at node F. In particular, capacitor C62 provides positive charge to capacitor C26. By charge balance, the reference voltage $V_{RH0AMP}$ at node F (line 20) rises as a function of time $t$ according to $$V_{RH0AMP}(t) \approx V_{RH} + \left(\frac{C_{PA}}{C_{LL} + C_{PA}}\right) \phi_6(t) \quad (6)$$

Charge sharing occurs among capacitors C25, C61, and C29 at nodes E and G. In particular, capacitor C61 provides positive charge to capacitors C25 and C29. For the case where node E leads node G by precisely a voltage $V_{TE}$, the input voltage $V_{LH0AMP}$ at node E (line 19) rises according to $$V_{LH0AMP}(t) \approx V_{LH0} + \left(\frac{C_{PA}}{C_{LL} + C_{PA} + C_{DL}}\right) \phi_6(t) \quad (7)$$

Upon noting that clock $\phi_6$ rises to voltage $V_{DD}$, the resulting amplified voltage difference $V_{0AMP}$ is $$V_{0AMP} = V_{LH0AMP} - V_{RH0AMP} \approx \quad (8)$$

$$\Delta V_0 - \left[\left(\frac{C_{PA}}{C_{LL} + C_{PA}}\right) - \left(\frac{C_{PA}}{C_{LL} + C_{PA} + C_{DL}}\right)\right] V_{DD}$$

Pre-amplified voltage difference $V_{0AMP}$ is negative which indicates that a "0" is being sensed.

At time $t_5$, as illustrated in FIG. 3a, voltage $V_{LH0AMP}$ (node E) is about 5.5 volts, and voltage $V_{RH0AMP}$ (node F) is about 6.6 volts. Consequently, amplified difference $\Delta V_{0AMP}$ is about $-1.1$ volts compared to original difference $\Delta V_0$ of $-0.1$ volt.

Realistically, it is sometimes desirable to adjust the system values so that node E temporarily rises more than a voltage $V_{TE}$ above node G during the pre-amp period. In this case, FET QE92 turns on for a short time and a race condition exists before FET QE92 goes back off. Amplified difference $\Delta V_{0AMP}$ decreases. However, sensing speed increases to counterbalance the loss in pre-amp gain.

Where a "1" is being read as clock $\phi_6$ goes high during the pre-amp period, substantially the inverse of the "0" sensing situation occurs. Node E rises above its pre-charge voltage ($V_{DD}$) causing FET QE92 to turn on first. Nodes F and G also rise as shown in FIG. 3c, but not as fast or as much as node E. Charge sharing occurs at nodes F and G. In particular, capacitor C62 provides positive charge to capacitors C26 and C29. For the case in which node F leads node G precisely by a voltage $V_{TE}$, the reference voltage $V_{RH1AMP}$ at node F (line 20) then rises according to $$V_{RH1AMP}(t) \approx \left(\frac{C_{PA}}{C_{LL} + C_{PA} + C_{DL}}\right) \phi_6(t) \quad (9)$$

At node E, capacitor C61 charge shares with, and provides positive charge to, capacitor C25. The input voltage $V_{LH1AMP}$ at node E (line 19) rises according to $$V_{LH1AMP}(t) \approx V_{LH1} + \left(\frac{C_{PA}}{C_{PA} + C_{LL}}\right) \phi_6(t) \quad (10)$$

Again noting that clock $\phi_6$ reaches voltage $V_{DD}$, the resulting amplified voltage difference $\Delta V_{1AMP}$ is $$\Delta V_{1AMP} = L_{LH1AMP} - V_{RH1AMP} \approx \quad (11)$$

$$\Delta V_1 + \left[\left(\frac{C_{PA}}{C_{LL} + C_{PA}}\right) - \left(\frac{C_{PA}}{C_{LL} + C_{PA} + C_{DL}}\right)\right] V_{DD}$$

At time $t_5$ as shown in FIG. 3c, voltage $V_{LH1AMP}$ (node E) is about 6.7 volts, and voltage $V_{RH1AMP}$ (node F) is about 5.6 volts. Consequently, amplified difference $\Delta V_{1AMP}$ is about 1.1 volts compared to original difference $\Delta V_1$ of 0.1 volt.

Again, depending on the system values, node F may rise more than a voltage $V_{TE}$ above node G during the pre-amp period so that FET QE91 turns on for a short time and a race condition exists before FET QE91 goes back off.

By time $t_5$, amplified difference $\Delta V_{AMP}$ (e.g., either $\Delta V_{0AMP}$ or $\Delta V_{1AMP}$) has been established between lines 19 and 20, and the pre-amp period is over. No changes occur in the voltages at nodes A, B, C, and D during the pre-amp period.

The principal sensing action of differential sensing device 90 is initiated at time $t_6$ by raising clock $\phi_7$ to its high value. This turns on FET QE7 in control device 70 and provides a path to ground for sensing device 90. Node G begins to drop rapidly toward zero volts.

Where a "0" is being sensed, FET QE91 is already on and turns on more as node G drops. Node E then discharges through FET QE91, trailing behind node G. Ideally, node E trails no more than a threshold voltage $V_{TE}$ behind node G; consequently, FET QE92 remains off. Node F drops a slight amount (but not below voltage $V_{DD}$) due to capacitive decoupling. In the non-ideal case where node G is more than a voltage $V_{TE}$ below node E at time $t_6$, FET QE92 begins to turn on; however, FET QE91 turns on more than FET QE92 so that node E is a voltage $V_{TE}$ or less behind node G in a short time and FET QE92 then turns back off. At time $t_7$, node E reaches a depletion-mode threshold voltage $V_{TD}$ below voltage $V_{DD}$; this causes FET Q51Y to being to turn on, and node C begins to drop toward zero volts. Since clock $\phi_{1,X}$ is high, and FET QE1 is on, node A in memory cell $11_{X,Y}$ likewise begins to drop, trailing closely behind node C. At time $t_8$, clock $\phi_{5,Y}$ goes high to turn FET QE51Y (and also FET QE52Y) on fully and speed up discharging of the left-hand (low) side of the sense amplifier. Clock $\phi_{5,Y+1}$ also goes high to turn on FET QD52$_{Y+1}$ (and QD51$_{Y+1}$) and discharge line 18$_{Y+1}$. Around time $t_8$, excess capacitive charge self injects into lines 19 and 20 causing the voltages at nodes E, F and G to reach temporary maxima as shown in FIG. 3a. Subsequently, nodes E, F, and G begin to drop again. By time $t_9$, which is typically about 40 nanoseconds after time $t_1$ node G, nodes E and C on the low side of the sense amplifier, and node A have dropped to zero volts.

Since node A reaches zero volts, the low logic state is restored to memory cell $11_{X,Y}$. In fact, the restored low logic state is better than the initial low logic state $(V_0)$ since it was a degraded "0" whereas the restored low logic state is a full "0".

With FET Q52Y turned on at time $t_8$, capacitive charge sharing causes nodes D and F to equalize at a common value by time $t_9$. Again, this common value is approximately voltage $V_{DD}$ plus a small voltage differential $\delta V$ which is about 0.1-0.2 volt in FIG. 3a (and FIG. 3c).

Where a "1" is being sensed when clock $\phi_7$ goes high at time $t_6$, substantially the inverse of the "0" sensing case occurs. FET QE92, which is already on, turns on more as node G drops. Node F discharges through FET QE92, ideally trailing no more than a voltage $V_{TE}$ behind node G so as to keep FET QE91 off. Capacitive charge sharing causes node E to drop slightly. In the non-ideal case where node G is more than a voltage $V_{TE}$ below node F at time $t_6$, FET QE91 turns slightly on for a short time until the greater conduction of FET QE92 forces FET QE91 back off. At time $t_7$, FET Q52Y begins to turn on and node D begins to drop as node F reaches a voltage $V_{TD}$ below voltage $V_{DD}$. Clock $\phi_{5,Y}$ goes high at time $t_8$ to turn on FET QE52Y (and also FET QE51Y) fully and accelerate discharging of the right-hand (low) side of the sense amplifier. Clock $\phi_{5,Y+1}$ also goes high to turn on FET QD51$_{Y+1}$ (and QD52$_{Y+1}$) and discharge line 17$_{Y+1}$. Around time $t_8$, excess capacitance again self injects into lines 19 and 20, causing nodes E, F, and G to reach temporary maxima. As shown in FIG. 3c, nodes E, F, and G subsequently begin to drop again. By time $t_9$ node G and nodes F and D on the low side of the sense amplifier have dropped to zero volts.

With FET QE1 already on and QE51Y turned on at time $t_8$, capacitive charge sharing causes nodes A, C, and E to equalize by time $t_9$ at voltage $V_{DD}$ plus differential $\delta V$. Since the voltage at node A exceeds voltage $V_{DD}$, the high logic state is restored to memory cell $11_{X,Y}$. In fact, the sense amplifier actually improves the final high logic state since it is slightly above a full "1" whereas the initial high logic state $(V_1)$ was a degraded "1".

Subsequently, another cycle starts as memory cell $11_{X,Y}$ is prepared for another sensing operation. The preparation steps for cell $11_{X,Y}$ apply generally to the other memory cells, including the particular memory cell interrogated on the next sensing operation. Accordingly, these preparatory steps are described only for cell $11_{X,Y}$.

At time $t_{10}$, word-line clock $\phi_{1,X}$ goes low to turn off FET QE1 and isolate memory cell $11_{X,Y}$ from line 17$_Y$ and the sense amplifier. If the alternative mode indicated by the dashed line in FIG. 3b is utilized, clock $\phi_3$ also goes low to turn off FET QE34$_Y$, thereby isolating reference cell 32$_Y$ from line 18$_Y$ and the rest of the sense amplifier.

At time $t_{11}$, pre-amp clock $\phi_6$ goes low. Capacitive charge sharing on the high side of the sense amplifier causes the high side to drop approximately down to voltage $V_{DD}$. Clock $\phi_7$ goes low to turn off FET QE7 in control device 70 and isolate node G from ground reference. The low side is now isolated from ground.

At time $t_{12}$, pre-charge clock $\phi_8$ does high to activate pre-charge device 80 by turning on FET's QE81 and QE82. Equalizing FET QE88 also turns on. Composite line $17_Y$ and 19 or $18_Y$ and 20 on the low side charges to the desired pre-charge voltage ($V_{DD}$). Line 95 (node G) rises to about a voltage $V_{TE}$ below voltage $V_{DD}$, causing coupling FET QE91 or QE92 on the low side to turn off. The other composite line $18_Y$ and 20 or $17_Y$ and 19 on the high side also adjusts to the pre-charge voltage. Since clock $\phi_{5,Y+1}$ is high, both sides connect through FET QE88 to equalize at the same voltage. Lines $17_{Y+1}$ and $18_{Y+1}$ likewise pre-charge to voltage $V_{DD}$.

The pre-charge period ends at time $t_{13}$ as clock $\phi_8$ goes low to de-activate pre-charge device 80 and turn off FET QE88. Clock $\phi_{5,Y+1}$ goes low to turn off coupling FET's $QD51_{Y+1}$ and $QD52_{Y+1}$ and isolate lines $17_{Y+1}$ and $18_{Y+1}$ from sensing device 90. A memory cell along either line $17_Y$ or $18_Y$ may now be interrogated. If a memory cell along line $17_{Y+1}$ or $18_{Y+1}$ is to be sensed, clock $\phi_{5,Y+1}$ stays high and clock $\phi_{5,Y}$ goes low to turn off FET's $QD51_Y$ and $QD52_Y$ so as to isolate lines $17_Y$ and $18_Y$ from sensing device 90.

Additionally, clock $\phi_4$ goes high at time $t_{12}$ to turn on $QE42_Y$, causing node B in reference cell $32_Y$ to drop to voltage $V_{REFO}$. At time $t_{13}$, clock $\phi_4$ returns to its low value to isolate node B and capacitor $C34_Y$ from voltage $V_{REFO}$.

At time $t_{14}$, the preparatory steps have been completed, and the sense amplifier is again ready to interrogate a memory cell.

The sense amplifier of the invention may be fabricated according to conventional semiconductor processing techniques. Preferably, the sense amplifier is manufactured according to the MOS fabrication techniques described in copending patent application, Ser. No. 104,639, "Voltage Protection Circuit for Binary Data-Storage Device", on an invention of John Y. Chan and John J. Barnes, filed 17 Dec. 1979 and now U.S. Pat. No. 4,311,930. This application is specifically incorporated by reference herein.

While the invention has been described with reference to particular embodiments, the description is solely for the purpose of illustration and is not to be construed as limiting the scope of the invention claimed below. For example, enhancement-mode devices could be used in place of the depletion-mode coupling transistors described in FIG. 2 if the high value of the coupler clocking signal is somewhat greater than an enhancement-mode threshold voltage above the pre-charge voltge. Thus, various modifications, changes, and applications may be made by those skilled in the art without departing from the true scope and spirit of the invention as defined by the appended claims.

What is claimed is:

1. An electronic circuit for determining the logic state of a memory cell existing selectively either in a low logic state or in a high logic state, the electronic circuit comprising:
    means for establishing a voltage difference between (1) a first input conductor coupled to the memory cell and (2) a first reference conductor, the sign of the voltage difference being indicative of the logic state;
    means for transferring the voltage on said first input conductor to a second input conductor and the voltage on said first reference conductor to a second reference conductor;
    means for selectively at least partially isolating said input conductors from each other and said reference conductors from each other.
    means for increasing the voltage on said second input conductor and on said second reference conductor after said input and reference conductors are isolated from each other;
    means for amplifying the voltage difference to generate an amplified voltage difference between the voltages on (1) said second input conductor coupled to said first input conductor and (2) said second reference conductor coupled to said first reference conductor; and
    means for sensing the amplified voltage difference to determine the logic state.

2. An electronic circuit as in claim 1 wherein the means for amplifying comprises:
    means for capacitively charging the second conductors to generate the amplified voltage difference.

3. An electronic circuit as in claim 1 wherein said means for isolating comprises:
    a first transistor having a pair of current-conducting electrodes coupled between the input conductors for selectively isolating the input conductors from each other; and
    a second transistor having a pair of current-conducting electrodes coupled between the reference conductors for selectively isolating the reference conductors from each other; and
    said voltage and amplifying means for increasing said voltage difference comprises:
    a first capacitor coupled between the second input conductor and a voltage input terminal for capacitively charging the second input conductor; and
    a second capacitor coupled between the second reference conductor and the voltage input terminal for capacitively charging the second reference conductor.

4. An electronic circuit as in claim 3 wherein the means for amplifying further includes:
    a third transistor having a pair of current-conducting electrodes coupled between the second input conductor and a third conductor and having a current-control electrode coupled to the second reference conductor; and
    a fourth transistor having a pair of current-conducting electrodes coupled between the second reference conductor and the third conductor and having a current-control electrode coupled to the second input conductor.

5. An electronic circuit as in claim 4 wherein the means for sensing comprises the third and fourth transistors.

6. An electronic circuit as in claim 3 or 5 wherein each transistor is a field-effect transistor.

7. An electronic circuit as in claim 2 or 3 wherein the means for establishing comprises:
    voltage reference means comprising a reference cell coupled to the first reference conductor; and
    means for charging the first conductors to a selected voltage, the voltage difference being established from the selected voltage by charge sharing along at least the first input conductor and the memory cell and by charge sharing along at least the first reference conductor and the reference cell.

8. An electronic circuit as in claim 7 wherein the means for charging further charges the second conductors to the selected voltage and the voltage difference is further established between the second conductors.

9. An electronic circuit for determining the logic state of a dynamic memory cell existing selectively either in a low logic state or in a high logic state wherein the electronic circuit has (a) means for establishing (1) a first input voltage on a first input conductor coupled to the memory cell and (2) a first reference voltage on a first reference conductor, the sign of the voltage difference between the first voltages being indicative of the logic state, (b) differential voltage sensing means coupled to (1) a second input conductor coupled to the first input conductor and (2) a second reference conductor coupled to the first reference conductor, characterized in that isolation means selectively at least partially isolates the amplifying means from the means for establishing, voltage increasing means increases the voltage on the second conductors, amplifying means amplify the voltage difference by capacitively charging the second conductors to generate an amplified voltage difference betweel (1) the increased voltage on the second input conductor and (2) the increased reference voltage on the second reference conductor, and the sensing means sense the amplified voltage difference to determine the logic state.

10. An electronic circuit as in claim 9 further characterized in that the amplifying means comprises (1) a first capacitor coupled between the second input conductor and a voltage input terminal and (2) a second capacitor coupled between the second reference conductor and the voltage input terminal.

11. A memory sensing circuit for sensing a voltage difference between voltages on a first and a second bit line of a memory comprising:
- a pair of cross-coupled transistors, each having a source, a gate, and a drain, wherein the gate of each transistor is coupled to the drain of the other transistor;
- a pair of transistors, each having a source, a drain and a gate, with the source of one of said pair coupled to the drain of one of said pair of cross-coupled transistors, respectively, and means for coupling their gates to a source of a first clock signal and their drains to a source of a first potential for applying said first potential to said drains of said pair of cross-coupled transistors for precharging said drains of said pair of cross-coupled transistors during the period of said first clock signal;
- a first transistor having a drain coupled to the drain of one of said pair of cross-coupled transistors and a source for coupling to said first bit line;
- a second transistor having a drain coupled to the drain of the other of said pair of cross-coupled transistors and a source for coupling to said second bit line; means coupling the gates of said first and second transistors to a source of a second clock signal for applying to said first and said second bit lines, respectively, said precharge potential on said drains of said pair of cross-coupled transistors coupled thereto during the period of said first clock signal;
- means for terminating said first clock signal before the termination of said second clock signal for transferring the voltages on said first and said second bit lines to the drains of said cross-coupled transistors coupled thereto, respectively;
- a pair of capacitive means having a first electrode coupled, respectively, to said drains of said pair of cross-coupled transistors and means for coupling a second electrode to a source of a third clock signal for increasing the potential on said drains of said pair of cross-coupled transistors above said precharge potential;
- means for isolating said first and said second bit lines from said pair of cross-coupled transistors during the period of said third clock signal; and
- means, including transistor means, coupled between the sources of said pair of cross-coupled transistors and ground for differentially discharging said drains of said pair of cross-coupled transistors during the period of said third clock signal, said differential discharging causing a voltage difference on said drains to be amplified.

12. A reference cell for a sense amplifier employable with an electronic memory having (1) a first memory cell coupled to a first bit line conductor and (2) a second memory cell coupled to a second bit line conductor, the reference cell comprising:
- a capacitor coupled between a first voltage source and a node;
- a first transistor having (1) a first current-conducting electrode coupled along a first reference line conductor through a first isolating device to the second bit line conductor, (2) a second current-conducting electrode coupled to the node, and (3) a current-control electrode for receiving a first control signal; and
- a second transistor having (1) a first current-conducting electrode coupled along a second reference line conductor through a second isolating device to the first bit line conductor, (2) a second current-conducting electrode coupled to the node, and (3) a current-control electrode for receiving the first control signal.

13. A reference cell as in claim 12 wherein the capacitor comprises at least one field-effect transistor, each field-effect transistor having (1) a pair of source-drain electrodes coupled to the node and (2) a gate electrode coupled to the first voltage source.

14. A reference cell as in claim 12 or 13 wherein each of the first and second transistors is a field-effect transistor and each of the first and second memory cells is a dynamic memory cell having its bit line conductor coupled through a pair of source-drain electrodes of a field-effect transistor to a capacitor coupled to a second voltage source.

15. A charging circuit for a sense amplifier employable with an electronic memory having (1) a first memory cell coupled to a first bit line, (2) a second memory cell coupled to a second bit line, the sense amplifier having means for differentially sensing a voltage difference between a pair of lines, (3) a third memory cell coupled to a third bit line coupled to one of the pair of lines and (4) a fourth memory cell coupled to a fourth bit line coupled to the other of the pair of lines, the charging circuit comprising:
- means for charging the pair of lines and each bit line substantially to a specified voltage.

16. A charging circuit as in claim 15 wherein the means for charging comprises:
- a transistor having (1) a pair of current-conducting electrodes coupled between a source of the specified voltage and one of the pair of lines and (2) a current-control electrode for receiving a second control signal; and a transistor having (1) a pair of current-conducting electrodes coupled between the source and the other of the pair of lines and (2) a current-control electrode for receiving the second control signal.

17. A charging circuit according to claim 15 comprising a transistor for equalizing voltage on the pair of lines at the specified voltage, the transistor having (1) a pair of current-conducting electrodes coupled between the bit lines and (2) a current-control electrode for receiving a first control signal, the first bit line coupled to one of the pair of lines and the second bit line coupled to the other of the pair of lines.

18. A charging circuit as in claim 16 wherein each transistor is a field-effect transistor and each memory cell is a dynamic memory cell.

19. A method for determining the logic state of a memory cell existing selectively either in a low logic state or in a high logic state comprising the steps of:

establishing a voltage difference between (1) a lower input line coupled through an upper input line to the memory cell and (2) a lower reference line coupled through an upper reference line to a reference cell, the sign of the voltage difference being indicative of the logic state;

isolating (1) the input lines from each other and (2) the reference lines from each other;

amplifying the voltage difference to generate an amplified voltage difference by capacitively charging the lower lines; and sensing the amplified voltage difference to determine the logic state.

20. A method as in claim 19 wherein the step of amplifying comprises applying a selected voltage to (1) a first capacitor coupled to the lower input line and (2) a second capacitor coupled to the lower reference line.

21. A method as in claim 19 wherein the step of establishing comprises the steps of:

isolating (1) the memory cell from the upper input line and (2) the reference cell from the upper reference line;

charging the input and reference lines to a specified voltage; and opening (1) the upper input line to the memory cell and (2) the upper reference line to the reference cell.

22. A method as in claim 21 and further including generally coincident with the step of sensing the step of substantially returning the memory cell to the logic state.

23. A method as in claim 22 wherein the step of sensing comprises activating differential sensing means coupled to the lower lines.

* * * * *